United States Patent
Khlat

(10) Patent No.: US 9,584,071 B2
(45) Date of Patent: Feb. 28, 2017

(54) ENVELOPE TRACKING WITH REDUCED DYNAMIC RANGE

(71) Applicant: RF Micro Devices, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/868,890

(22) Filed: Sep. 29, 2015

(65) Prior Publication Data

US 2016/0099687 A1    Apr. 7, 2016

Related U.S. Application Data

(60) Provisional application No. 62/059,260, filed on Oct. 3, 2014.

(51) Int. Cl.

| | |
|---|---|
| *H01B 1/04* | (2006.01) |
| *H01Q 11/12* | (2006.01) |
| *H03F 3/04* | (2006.01) |
| *H03F 1/02* | (2006.01) |
| *H03G 3/30* | (2006.01) |
| *H04B 1/04* | (2006.01) |

(Continued)

(52) U.S. Cl.
CPC .............. *H03F 1/0227* (2013.01); *H03F 3/19* (2013.01); *H03F 3/245* (2013.01); *H03G 3/3036* (2013.01); *H04B 1/04* (2013.01); *H03F 2200/102* (2013.01); *H03F 2200/451* (2013.01); *H04B 2001/0416* (2013.01)

(58) Field of Classification Search
CPC .... H03F 1/0211; H03F 1/0222; H03F 1/0227; H03F 1/025; H03F 1/0266; H03F 3/189; H03F 2200/78; H03F 2200/129; H03F 2200/451; H04B 1/04; H04B 1/40; H04B 1/0475; H04B 1/1607; H04B 2001/0416; H04B 2001/045; H04M 19/08
USPC ......... 455/114.1, 114.2, 115.1, 115.3, 127.1, 455/127.2, 572, 574; 330/75, 279, 297
See application file for complete search history.

(56) References Cited

U.S. PATENT DOCUMENTS

| | | |
|---|---|---|
| 7,043,213 B2 | 5/2006 | Robinson et al. |
| 7,570,931 B2 | 8/2009 | McCallister et al. |

(Continued)

OTHER PUBLICATIONS

Non-Final Office Action for U.S. Appl. No. 14/836,634, mailed May 16, 2016, 9 pages.

*Primary Examiner* — Quochien B Vuong
(74) *Attorney, Agent, or Firm* — Withrow & Terranova, P.L.L.C.

(57) ABSTRACT

Envelope power supply circuitry includes power converter circuitry and envelope tracking circuitry. The power converter circuitry is configured to receive an envelope power converter control signal and a supply voltage and provide an envelope power supply signal for an amplifier from the supply voltage and based on the envelope power converter control signal. The envelope tracking circuitry is coupled to the power converter circuitry. In a first mode of operation, the envelope tracking circuitry is configured to provide the envelope power converter control signal such that a gain of the amplifier remains substantially constant over a range of input power provided to the amplifier. In a second mode of operation, the envelope tracking circuitry is configured to limit the dynamic range of the envelope power supply signal.

18 Claims, 6 Drawing Sheets

(51) Int. Cl.
*H03F 3/19* (2006.01)
*H03F 3/24* (2006.01)

(56) References Cited

U.S. PATENT DOCUMENTS

| | | | |
|---|---|---|---|
| 8,461,928 B2* | 6/2013 | Yahav | H03G 3/007 |
| | | | 330/279 |
| 8,989,682 B2* | 3/2015 | Ripley | H03F 1/0227 |
| | | | 455/115.1 |
| 9,166,830 B2* | 10/2015 | Camuffo | H03F 1/02 |
| 9,225,362 B2* | 12/2015 | Drogi | H04B 1/0458 |
| 9,263,997 B2* | 2/2016 | Vinayak | H03F 1/0233 |
| 9,356,512 B2* | 5/2016 | Chowdhury | H02M 3/158 |
| 2016/0065137 A1 | 3/2016 | Khlat | |

* cited by examiner

ENVELOPE TRACKING WITH REDUCED DYNAMIC RANGE

RELATED APPLICATIONS

This application claims the benefit of U.S. provisional patent application No. 62/059,260, filed Oct. 3, 2014, the disclosure of which is incorporated herein by reference in its entirety.

FIELD OF THE DISCLOSURE

The present disclosure relates to envelope tracking systems and methods.

BACKGROUND

Many modern electronic devices include wireless communications circuitry. For example, an electronic device may include wireless local area network (WLAN) communications circuitry, cellular communications circuitry, or the like. While wireless communications circuitry allows electronic devices to communicate with one another, such functionality generally comes at the cost of additional energy consumption and thus reduced battery life. Often, wireless communications circuitry is the largest consumer of energy in an electronics device. As wireless communications protocols evolve to provide higher speeds, energy consumption of communications circuitry often increases to meet the higher demands of such protocols.

Consumer demand for longer battery life from electronic devices has resulted in the development of many power-saving techniques for wireless communications. One way to conserve power consumed via wireless communications is through the use of envelope tracking. Envelope tracking involves modulating a supply voltage provided to an amplifier based on the instantaneous magnitude (i.e., the envelope) of an RF input signal provided to the amplifier. FIG. 1 illustrates the basic concept of envelope tracking. Specifically, FIG. 1 shows an amplitude-modulated RF signal 10. Conventionally, a constant supply voltage at a level sufficient to ensure adequate headroom across the entire amplitude range of the RF signal 10 would be supplied to an RF amplifier, as shown by line 12. This results in a significant amount of wasted energy, and thus poor efficiency, when the amplitude of the RF carrier is below the maximum level, as illustrated by line 14. Accordingly, an envelope power supply signal tracks the amplitude of the RF signal 10, as illustrated by line 16, and therefore increases efficiency by preventing the unnecessary expenditure of power when the amplitude of the RF signal is below the maximum level.

Generally, an envelope power supply signal should track the envelope of an RF signal from the highest peak to the lowest trough. This means that the dynamic range of the envelope tracking power supply signal must be large enough to cover the entire amplitude range of the RF signal. In general, the larger the dynamic range of the envelope power supply signal, the larger the supply voltage necessary to provide power to envelope power supply circuitry providing the envelope power supply signal. In other words, a larger dynamic range of an envelope power supply signal is generally associated with higher supply voltages and therefore higher power consumption. In order to accommodate a variety of RF signals, the supply voltage to envelope power supply circuitry is generally set based on the worst-case scenario, or the largest possible amplitude range of an RF signal. This often results in unnecessarily large supply voltages provided to an envelope power supply, which degrades efficiency and battery life.

In light of the above, there is a need for wireless communications circuitry with improved efficiency.

SUMMARY

The present disclosure relates to envelope tracking systems and methods. In one embodiment, envelope power supply circuitry includes power converter circuitry and envelope tracking circuitry. The power converter circuitry is configured to receive an envelope power converter control signal and a supply voltage and provide an envelope power supply signal for an amplifier from the supply voltage and based on the envelope power converter control signal. The envelope tracking circuitry is coupled to the power converter circuitry. In a first mode of operation, the envelope tracking circuitry is configured to provide the envelope power converter control signal such that a gain of the amplifier remains substantially constant over a range of input power provided to the amplifier. In a second mode of operation, the envelope tracking circuitry is configured to provide the envelope power converter control signal such that the envelope power supply signal is fixed at a predetermined minimum value for values in the range of input power below an input power threshold such that the dynamic range of the envelope power supply signal is limited. Further, the envelope tracking circuitry is configured to provide the envelope power converter control signal such that the gain of the amplifier remains substantially constant for values in the range of input power above the input power threshold. By limiting the dynamic range of the envelope power supply signal in the second mode of operation, the supply voltage can be reduced, thereby decreasing the energy consumption of a device incorporating the envelope power supply circuitry.

In one embodiment, the input power threshold is about −20 dBm. The envelope tracking circuitry may include a gain-shaping look-up table configured to receive an envelope tracking signal and provide the envelope power converter control signal. Further, the envelope tracking circuitry may further include envelope detection circuitry configured to detect an envelope of an input signal to the amplifier and provide the envelope tracking signal.

In one embodiment, the envelope power supply circuitry is configured to operate in the first mode of operation when an average output power of the amplifier is below an average output power threshold. Further, the envelope power supply circuitry may be configured to operate in the second mode of operation when the average output power of the amplifier is above the average output power threshold. In one embodiment, the average output power threshold is about +10 dBm.

In one embodiment, a radio frequency (RF) transmitter includes modulator circuitry, an amplifier, front end circuitry, and envelope power supply circuitry. The modulator circuitry is configured to receive a baseband signal and provide an RF input signal. The amplifier is configured to receive and amplify the RF input signal using an envelope power supply signal to provide an RF output signal. The front end circuitry is configured to receive the RF output signal and provide the RF output signal to an antenna for transmission. The envelope power supply circuitry includes power converter circuitry and envelope tracking circuitry. The power converter circuitry is configured to receive an envelope power converter control signal and a supply voltage and provide an envelope power supply signal for an amplifier from the supply voltage and based on the envelope power converter control signal. The envelope tracking circuitry is coupled to the power converter circuitry. In a first mode of operation, the envelope tracking circuitry is configured to provide the envelope power converter control signal such that a gain of the amplifier remains substantially constant over a range of input power provided to the amplifier. In a second mode of operation, the envelope tracking circuitry is configured to provide the envelope power converter control signal such that the envelope power supply signal is fixed at a predetermined minimum value for values in the range of input power below an input power threshold such that the dynamic range of the envelope power supply signal is limited. Further, the envelope tracking circuitry is configured to provide the envelope power converter control signal such that the gain of the amplifier remains substantially constant for values in the range of input power above the input power threshold. By limiting the dynamic range of the envelope power supply signal in the second mode of operation, the supply voltage can be reduced, thereby decreasing the energy consumption of a device incorporating the envelope power supply circuitry.

In one embodiment, a method includes the steps of providing an envelope power supply signal to an amplifier such that a gain of the amplifier remains substantially constant over a range of input power to the amplifier in a first mode of operation. In a second mode of operation, the envelope power supply signal is provided to the amplifier such that the envelope power supply signal is fixed at a predetermined minimum value for values in the range of input power below an input power threshold such that the dynamic range of the envelope power supply signal is limited. Further, the envelope power supply signal is provided to the amplifier such that the gain of the amplifier remains substantially constant for values in the range of input power above the input power threshold. By limiting the dynamic range of the envelope power supply signal in the second mode of operation, the supply voltage can be reduced, thereby decreasing the energy consumption of a device incorporating the envelope power supply circuitry.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 2:
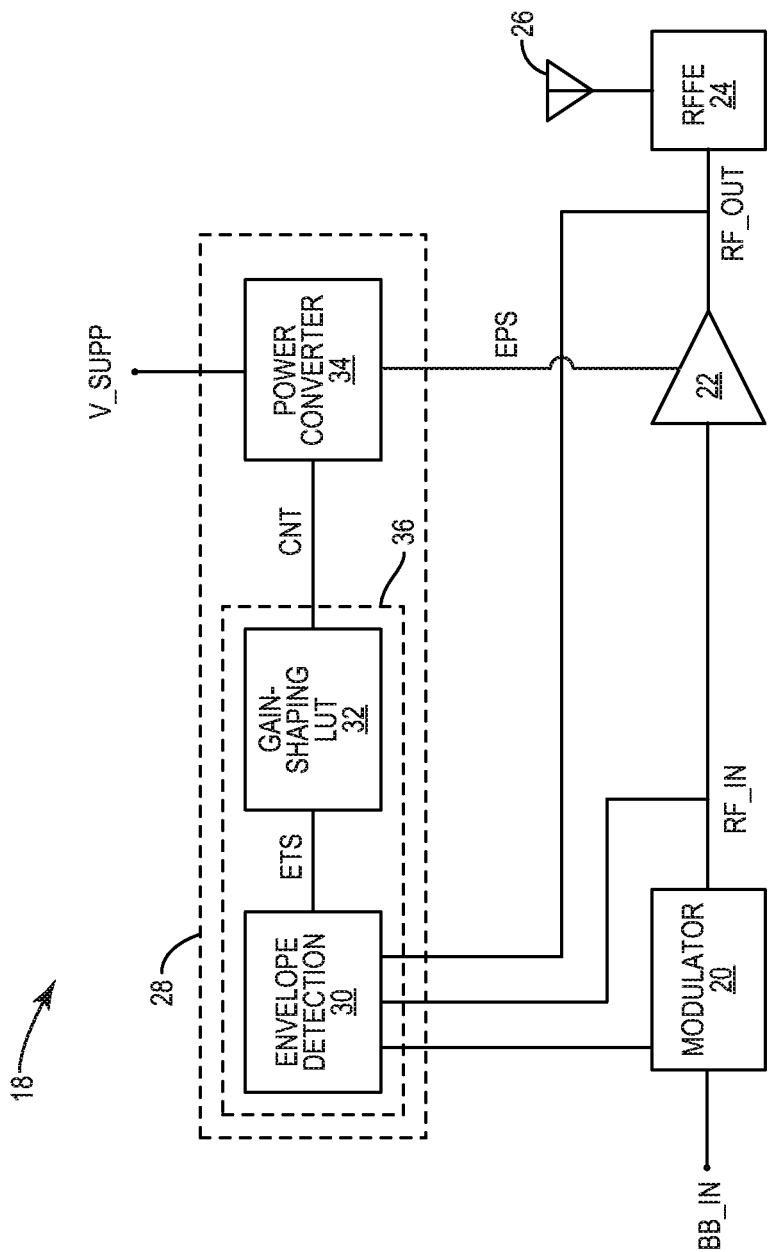
FIG. 2 is a diagram illustrating a radio frequency (RF) transmitter according to one embodiment of the present disclosure.

FIG. 2 is a diagram of a radio frequency (RF) transmitter 18 according to one embodiment of the present disclosure. The RF transmitter 18 includes modulator circuitry 20 configured to receive a baseband input signal BB_IN and provide an RF input signal RF_IN to an input of an RF amplifier 22. The RF amplifier 22 amplifies the RF input signal RF_IN using an envelope power supply signal EPS to provide an RF output signal RF_OUT to RF front end circuitry 24. The RF front end circuitry 24 may appropriately filter the RF output signal RF_OUT and provide it to an antenna 26, which may be one of a number of antennas (not shown for purposes of clarity).

Envelope power supply circuitry 28 is coupled to one or more of the modulator circuitry 20, the input of the RF amplifier 22, and the output of the RF amplifier 22. The envelope power supply circuitry 28 includes envelope detection circuitry 30, a gain-shaping look-up table 32, and envelope power converter circuitry 34. Together, the envelope detection circuitry 30 and the gain-shaping look-up table 32 are referred to as envelope tracking circuitry 36. The envelope detection circuitry 30 may receive one or more of an envelope signal from the modulator (e.g., an in-phase component and a quadrature component of the baseband input signal BB_IN), the RF input signal RF_IN, and the RF output signal RF_OUT, and provide an envelope tracking signal ETS to the gain-shaping look-up table 32. The gain-shaping look-up table 32 receives the envelope tracking signal ETS and provides a gain-shaped envelope signal, referred to as an envelope power converter control signal CNT, to the envelope power converter circuitry 34 based thereon. The envelope power converter circuitry 34 receives the envelope power converter control signal CNT and a supply voltage V_SUPP and provides the envelope power supply signal EPS based thereon.

The envelope power supply circuitry 28 is configured to operate in a first mode of operation and a second mode of operation. In the first mode of operation of the envelope power supply circuitry 28, the gain-shaping look-up table 32 provides the envelope power converter control signal CNT such that envelope power supply signal EPS causes the gain of the RF amplifier 22 to remain substantially constant regardless of the input power provided to the RF amplifier 22. As will be appreciated by those of ordinary skill in the art, the gain of the RF amplifier 22 is dependent on both input power and supply voltage. In other words, changing the input power of the RF amplifier 22 or the supply voltage provided to the RF amplifier 22 may also change the gain of the amplifier. This may in turn cause amplitude modulation (AM) to AM distortion in the RF output signal RF_OUT, especially when the RF amplifier 22 is operated using an envelope power supply modulation scheme. One way to avoid this AM to AM distortion is by providing the envelope power supply signal EPS according to an isogain contour of the RF amplifier 22. An isogain contour defines a relationship between input power and power supply voltage for an amplifier that will produce a substantially constant gain. Providing a supply voltage to an amplifier according to an isogain contour allows the gain of the amplifier to remain substantially constant over most if not all of the range of input power provided to the amplifier, thereby significantly reducing or eliminating AM to AM distortion in an RF output signal due to envelope power supply modulation.

In the second mode of operation of the envelope power supply circuitry 28, the gain-shaping look-up table 32 provides the envelope power converter control signal CNT such that the envelope power supply signal EPS is substantially constant when the input power provided to the RF amplifier 22 is below a predetermined input power threshold. When the input power provided to the RF amplifier 22 is above the predetermined input power threshold, the gain-shaping look-up table 32 provides the envelope power converter control signal CNT such that the gain of the RF amplifier 22 remains substantially constant. In other words, when the input power provided to the RF amplifier 22 is above the predetermined input power threshold, the gain-shaping look-up table 32 provides the envelope power converter control signal CNT such that the envelope power supply signal EPS follows an isogain contour of the RF amplifier 22.

The second mode of operation effectively reduces the dynamic range of the envelope power supply signal EPS. As discussed above, the dynamic range of the envelope power supply signal EPS determines the necessary level of the supply voltage V_SUPP. Specifically, the supply voltage V_SUPP must be as large or larger than the dynamic range of the envelope power supply signal EPS. The magnitude of the supply voltage V_SUPP directly affects the power consumption of the RF transmitter 18, such that an increase in the supply voltage V_SUPP consumes more power in the RF transmitter 18. By reducing the dynamic range of the envelope power supply signal EPS in the second mode of operation, the supply voltage V_SUPP can similarly be reduced. Accordingly, the power consumption of the RF transmitter 18 can be reduced in turn.

Notably, providing the envelope power supply signal EPS as described above in the second mode of operation results in AM to AM distortion when the input power provided to the RF amplifier 22 is below the input power threshold. This will increase the error vector magnitude of the RF transmitter 18, which is undesirable. However, the second mode of operation of the envelope power supply circuitry 28 may only be used when the average output power of the RF amplifier 22 is above a predetermined output power threshold. When the average output power of the RF amplifier 22 is above a predetermined output power threshold, the probability that the input power will fall below the predetermined input power threshold is quite low. This is due to the fact that the output power is determined by the input power (the gain of the RF amplifier 22 remains constant due to the envelope power supply signal EPS as discussed above). Accordingly, the error vector magnitude remains substantially unaffected, even when the dynamic range of the envelope power supply signal EPS is reduced. In one embodiment, the predetermined output power threshold is +10 dBm.

Figure 3:
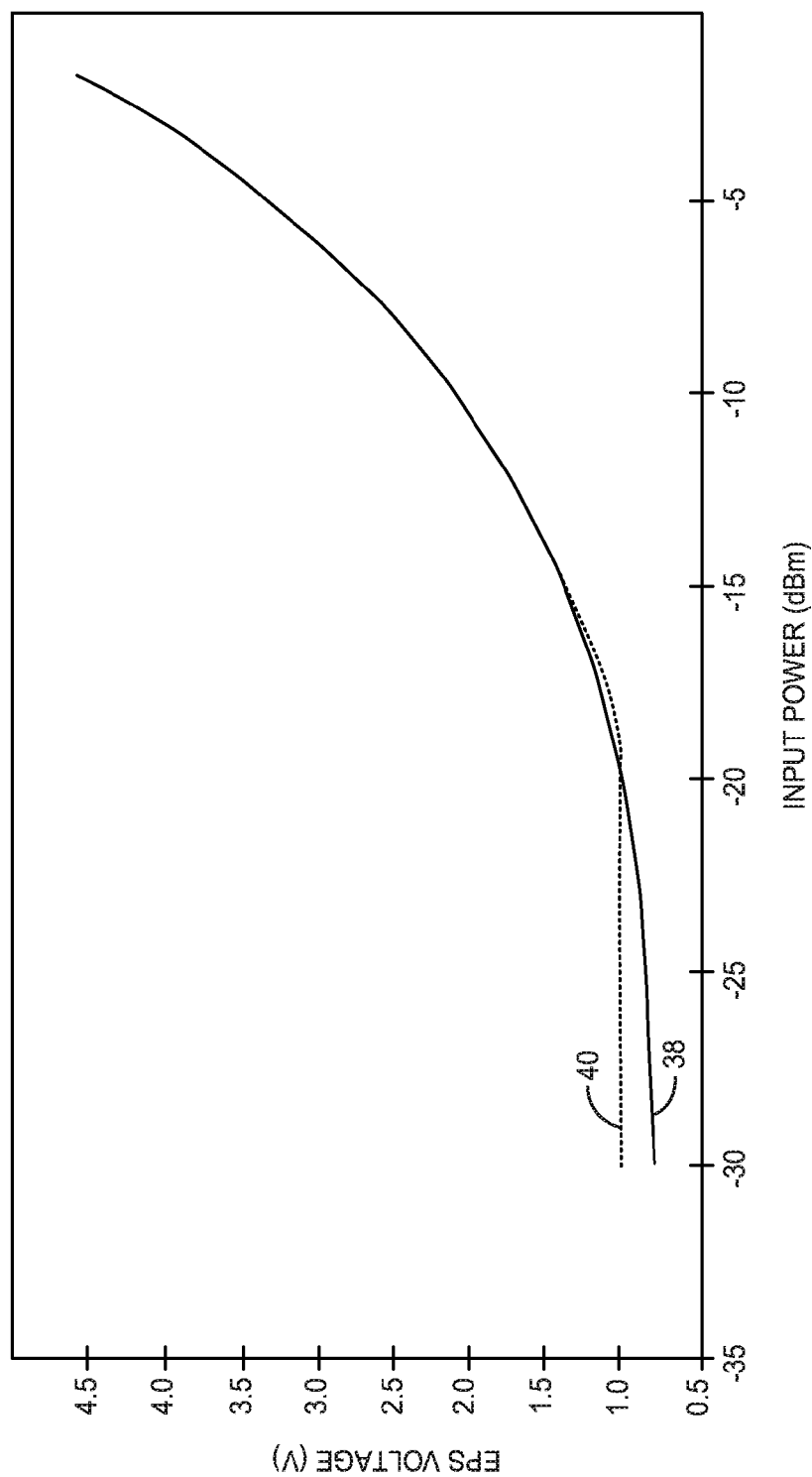
FIG. 3 is a graph illustrating a power modulation technique according to one embodiment of the present disclosure.

FIG. 3 is a graph illustrating the concepts described above. Specifically, FIG. 3 shows the voltage of the envelope power supply signal EPS for a variety of input power levels of the RF input signal RF_IN. A full dynamic range curve 38 is shown as a solid line. The full dynamic range curve 38 represents the envelope power supply voltage necessary to maintain a constant gain of the amplifier for a particular output power level. In other words, the full dynamic range curve 38 is one of a number of isogain contours for the RF amplifier 22. A reduced dynamic range curve 40 is shown as a dashed line. The reduced dynamic range curve 40 remains substantially constant (i.e., is set at a predetermined minimum value) for input power levels below −20 dBm, then begins to follow the full dynamic range curve 38. Specifically, the reduced dynamic range curve 40 is clipped around 1 V. Notably, this value is only exemplary. That is, the reduced dynamic range curve 40 may be clipped at any predetermined minimum value without departing from the principles of the present disclosure. The larger the predetermined minimum value, the less the dynamic range of the envelope power supply signal EPS. However, reducing the dynamic range of the envelope power supply signal EPS will generally increase the error vector magnitude of the RF transmitter 18 due to an increase in AM to AM distortion caused by clipping of the signal. Accordingly, the particular predetermined minimum value at which the reduced dynamic range curve 40 is clipped must be chosen with the error vector magnitude in mind.

As shown in FIG. 3, the dynamic range of the full dynamic range curve 38 is about 4.25V (4.5V maximum-0.25V minimum). The dynamic range of the reduced dynamic range curve 40 may be about 3.5V (4.5V maximum-1.0V minimum) Accordingly, the supply voltage V_SUPP may be reduced by about 0.75V, which may save a significant amount of power in a device in which the RF transmitter 18 is provided and therefore prolong the battery life thereof. As discussed above, the envelope power supply signal EPS may be provided according to the full dynamic range curve 38 in situations in which the average output power of the RF amplifier 22 is below a predetermined output power threshold. This is because there is a strong likelihood that the RF input signal RF_IN will include signal components that fall below −20 dBm, and therefore that the RF output signal RF_OUT will include significant AM to AM distortion if the reduced dynamic range curve 40 is used. Further, the dynamic range of the envelope power supply signal EPS is already reduced when the output power level is below +10 dBm, since the peak input power provided to the RF amplifier 22 will be lowered. When the average output power of the RF amplifier 22 is above the predetermined output power threshold, there is a very low likelihood that the RF input signal will include signal components that fall below −20 dBm, and therefore the RF output signal RF_OUT will include very little AM to AM distortion. Accordingly, the supply voltage V_SUPP can be reduced in those times when it will not significantly affect the error vector magnitude of the RF transmitter 18, allowing for power savings while maintaining the same or similar performance as an RF transmitter using conventional envelope modulation techniques.

Figure 1:
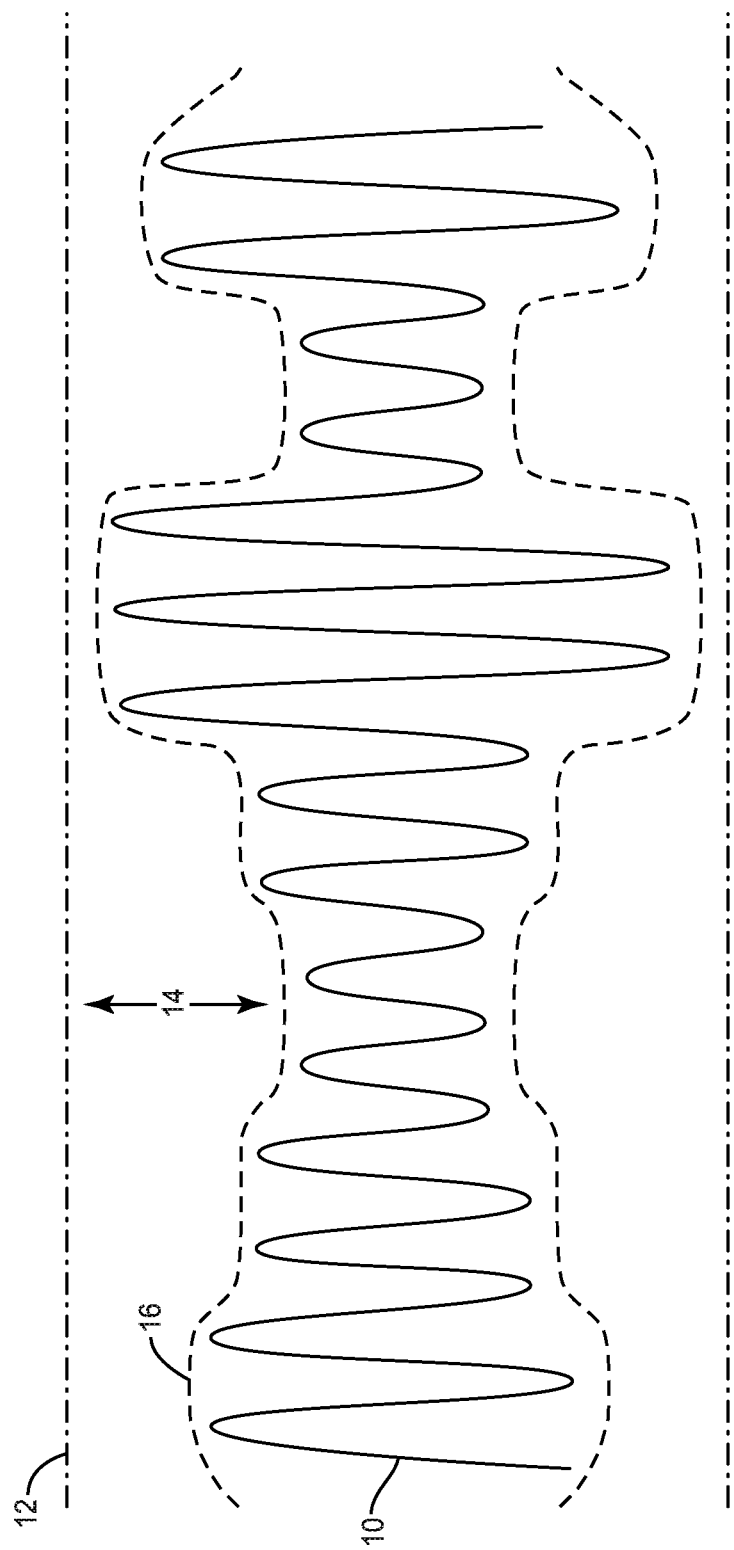
FIG. 1 is a plot illustrating conventional envelope tracking techniques.
Figure 4:
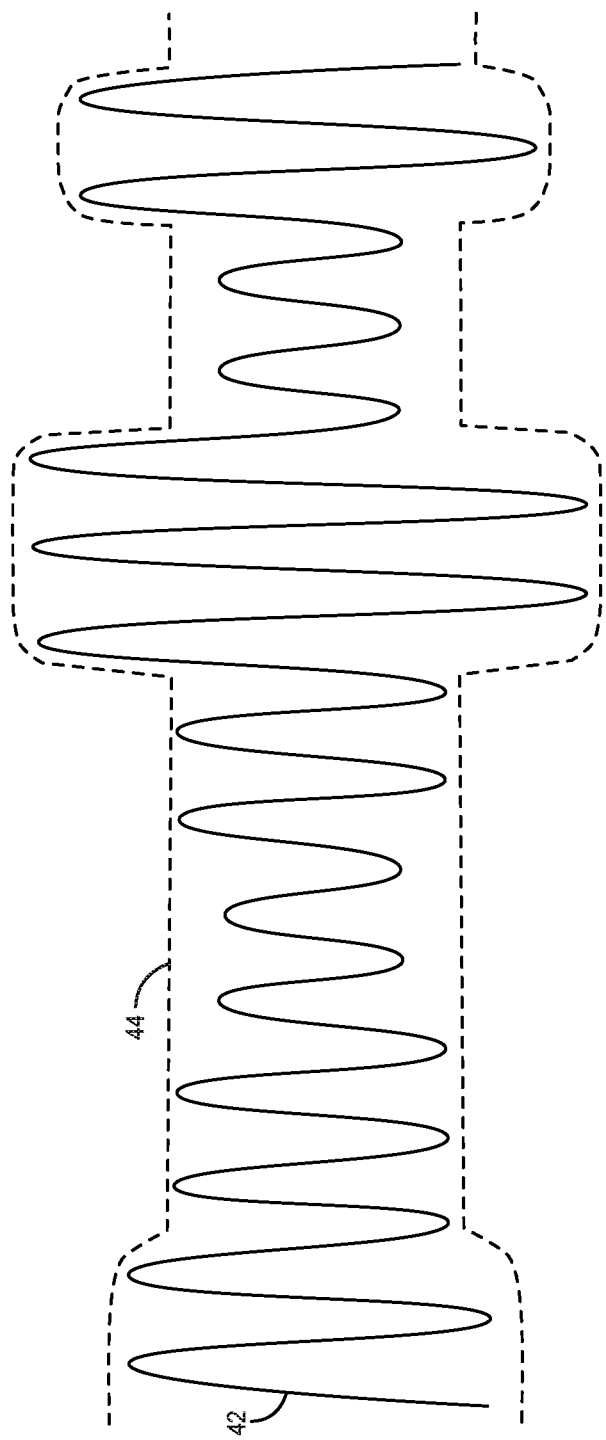
FIG. 4 is a plot illustrating the power modulation technique shown in FIG. 3 according to one embodiment of the present disclosure.

FIG. 4 is a graph illustrating the dynamic range reduction techniques discussed above. FIG. 4 shows the same amplitude modulated RF signal 42 discussed above with respect to FIG. 1. Line 44 illustrates the reduced dynamic range envelope modulation technique, wherein for input power levels of the amplitude modulated RF signal 42 below a predetermined threshold, the voltage level of an envelope power supply signal remains substantially constant. When the input power exceeds the predetermined threshold, the envelope power supply signal tracks the envelope of the signal. As discussed above, this allows the supply voltage V_SUPP to be reduced during these times, thereby saving power.

Figure 5:
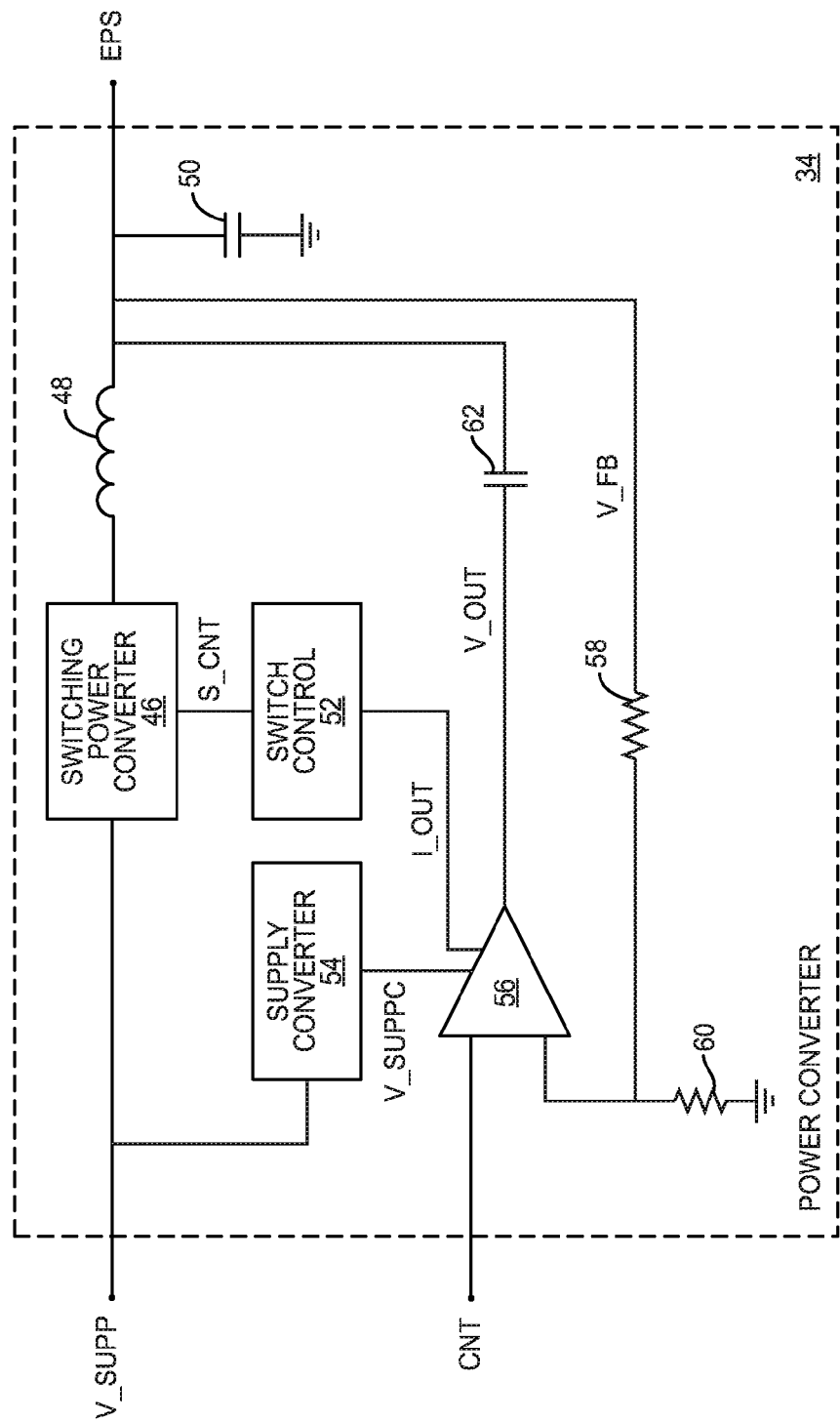
FIG. 5 is a flow diagram illustrating a method of operating envelope power supply circuitry according to one embodiment of the present disclosure.

FIG. 5 shows details of the envelope power converter circuitry 34 according to one embodiment of the present disclosure. The envelope power converter circuitry 34 includes switching power converter circuitry 46 configured to receive the supply voltage V_SUPP and provide a stepped-up or stepped-down version thereof to a holding inductor 48 and a smoothing capacitor 50 based on a switching control signal S_CNT provided by the switching control circuitry 52. Supply voltage converter circuitry 54 also receives the supply voltage V_SUPP and provides a converted supply voltage V_SUPPC to a control amplifier 56. The control amplifier 56 receives the envelope power converter control signal CNT from the envelope tracking circuitry 36, and in particular, the gain-shaping look-up table 32. Further, the control amplifier 56 receives a feedback signal V_FB via a voltage divider formed from an isolation resistance 58 and a divider resistance 60 from an output of the envelope power converter circuitry 34. As will be appreciated by those of ordinary skill in the art, the control amplifier 56 may be an operational amplifier configured to equalize the envelope power converter control signal CNT and the feedback signal V_FB by changing an output voltage V_OUT and an output current I_OUT provided therefrom. The output current I_OUT from the control amplifier 56 may be delivered to the switching control circuitry 52, which generates the switching control signal S CNT based thereon. The output voltage V_OUT of the control amplifier 56 may be delivered to an output of the envelope power converter circuitry 34 via a bypass capacitor 62. In short, the switching power converter circuitry 46 provides the majority of the envelope power supply signal EPS via the holding inductor 48 based on control signals that are derived from the control amplifier 56. In situations in which the switching power converter circuitry 46 cannot instantaneously provide a desired magnitude of the envelope power supply signal EPS, for example, due to a very high bandwidth thereof, the control amplifier 56 may supplement the output of the switching power converter circuitry 46 by sinking voltage from the bypass capacitor 62.

In general, the converted supply voltage V_SUPPC is provided based on the requirements of the control amplifier 56. When the dynamic range of the envelope power supply signal EPS is high, the converted supply voltage V_SUPPC must also be high such that the control amplifier 56 has the necessary power to avoid generating an undershoot in the envelope power supply signal EPS and thus clipping of the RF output signal RF_OUT. When the dynamic range of the envelope power supply signal EPS is reduced, the converted supply voltage V_SUPPC can also be reduced, which saves power and increases efficiency in the envelope power converter circuitry 34.

Figure 6:
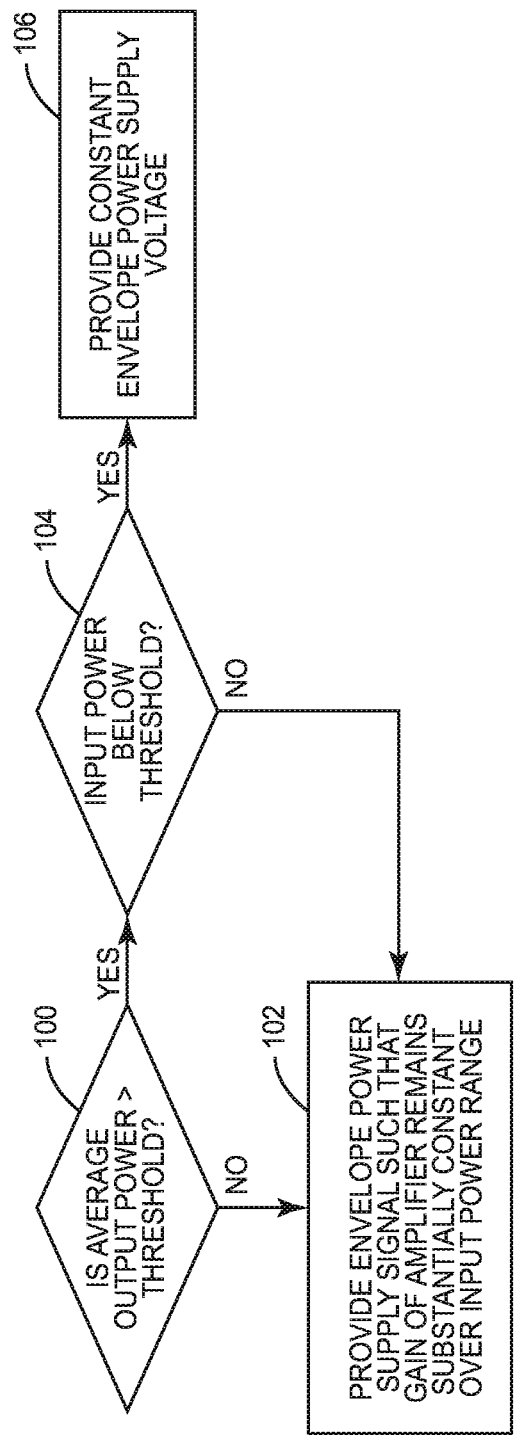
FIG. 6 is a flow diagram illustrating a method for providing an envelope power supply signal according to one embodiment of the present disclosure.

FIG. 6 is a flow diagram illustrating the principles discussed above. First, a decision is made regarding whether or not the average output power of the RF amplifier 22 is above the predetermined output power threshold (step 100). If the average output power of the RF amplifier 22 is not above the predetermined output power threshold, the envelope power supply signal EPS is provided such that the gain of the amplifier remains substantially constant over the input power range of the RF input signal RF_IN (step 102). In other words, the envelope power supply signal is provided according to an isogain contour of the RF amplifier 22. If the average output power of the RF amplifier 22 is above the predetermined output power threshold, a decision is then made regarding whether the input power provided to the RF amplifier 22 is below a predetermined threshold (step 104). If the input power provided to the RF amplifier 22 is below the predetermined threshold, the envelope power supply signal EPS is provided as a constant voltage at the predetermined minimum value (step 106). If the input power provided to the RF amplifier 22 is above the predetermined threshold, the process returns to step 102 and the envelope power supply signal EPS is provided such that the gain of the amplifier remains substantially constant over the input power range of the RF input signal RF_IN (i.e., provided according to an isogain contour of the RF amplifier 22).

Those skilled in the art will recognize improvements and modifications to the embodiments of the present disclosure. All such improvements and modifications are considered within the scope of the concepts disclosed herein and the claims that follow.

What is claimed is:

1. Envelope power supply circuitry comprising:
   power converter circuitry configured to receive an envelope power converter control signal and a supply voltage and provide an envelope power supply signal for an amplifier from the supply voltage and based on the control signal; and
   envelope tracking circuitry coupled to the power converter circuitry and configured to provide the envelope power converter control signal such that:
   in a first mode of operation when an average output power of the amplifier is below an average output power threshold, a gain of the amplifier remains substantially constant over a range of input power provided to the amplifier; and
   in a second mode of operation when the average output power of the amplifier is above the average output power threshold:
   the envelope power supply signal is fixed at a predetermined minimum value for values in the range of input power below an input power threshold such that a dynamic range of the envelope power supply signal is limited; and
   the gain of the amplifier remains substantially constant for values in the range of input power above the input power threshold.

2. The envelope power supply circuitry of claim 1 wherein the input power threshold is about −20 dBm.

3. The envelope power supply circuitry of claim 1 wherein the envelope tracking circuitry comprises a gain-shaping look-up table configured to receive an envelope tracking signal and provide the envelope power converter control signal.

4. The envelope power supply circuitry of claim 3 wherein the envelope tracking circuitry further comprises envelope detection circuitry configured to detect an envelope of an input signal to the amplifier to provide the envelope tracking signal.

5. The envelope power supply circuitry of claim 1 wherein the average output power threshold is about +10 dBm.

6. The envelope power supply circuitry of claim 5 wherein the input power threshold is about −20 dBm.

7. The envelope power supply circuitry of claim 1 wherein the amplifier is configured to provide a wireless local area network (WLAN) output signal.

8. The envelope power supply circuitry of claim 7 wherein the amplifier is configured to provide a WiFi output signal.

9. A radio frequency (RF) transmitter comprising:
   modulator circuitry configured to receive a baseband signal and provide an RF input signal;
   an amplifier configured to receive and amplify the RF input signal using an envelope power supply signal to provide an RF output signal;

front end circuitry configured to receive the RF output signal and provide the RF output signal to an antenna for transmission;

envelope power supply circuitry comprising:
- power converter circuitry configured to receive an envelope power converter control signal and a supply voltage and provide an envelope power supply signal for an amplifier from the supply voltage and based on the envelope power converter control signal; and
- envelope tracking circuitry coupled to the power converter circuitry and configured to provide the envelope power converter control signal such that:
  - in a first mode of operation when an average output power of the amplifier is below an average output power threshold, a gain of the amplifier remains substantially constant over a range of input power provided to the amplifier; and
  - in a second mode of operation when the average output power of the amplifier is above the average output power threshold:
    - the envelope power supply signal is fixed at a predetermined minimum value for values in the range of input power below an input power threshold; and
    - the gain of the amplifier remains substantially constant for values in the range of input power above the input power threshold such that a dynamic range of the envelope power supply signal is limited.

10. The RF transmitter of claim 9 wherein the input power threshold is about −20 dBm.

11. The RF transmitter of claim 9 wherein the envelope tracking circuitry comprises a gain-shaping look-up table configured to receive an envelope tracking signal and provide the envelope power converter control signal.

12. The RF transmitter of claim 11 wherein the envelope tracking circuitry further comprises envelope detection circuitry configured to detect an envelope of an input signal to the amplifier to provide the envelope tracking signal.

13. The RF transmitter of claim 9 wherein the average output power threshold is about +10 dBm.

14. The RF transmitter of claim 13 wherein the input power threshold is about −20 dBm.

15. The RF transmitter of claim 9 wherein the amplifier is configured to provide a wireless local area network (WLAN) output signal.

16. The RF transmitter of claim 15 wherein the amplifier is configured to provide a WiFi output signal.

17. A method comprising:
- in a first mode of operation of envelope power supply circuitry when an average output power of the amplifier is below an average output power threshold, providing an envelope power supply signal to an amplifier such that a gain of the amplifier remains substantially constant over a range of input power to the amplifier; and
- in a second mode of operation of the envelope power supply circuitry when the average output power of the amplifier is above the average output power threshold, providing the envelope power supply signal to the amplifier such that:
  - the envelope power supply signal is fixed at a predetermined minimum value for values in the range of input power below an input power threshold such that a dynamic range of the envelope power supply signal is limited; and
  - the gain of the amplifier remains substantially constant for values in the range of input power above the input power threshold.

18. The method of claim 17 wherein the input power threshold is about −20 dBm.

* * * * *